United States Patent [19]

Moritz

[11] 4,378,383
[45] Mar. 29, 1983

[54] METHOD OF MAKING CONDUCTIVE PATHS THROUGH A LAMINA IN A SEMICONDUCTOR DEVICE

[75] Inventor: Holger Moritz, Holzgerlingen, Fed. Rep. of Germany

[73] Assignee: International Business Machines Corporation, Armonk, N.Y.

[21] Appl. No.: 312,198

[22] Filed: Oct. 19, 1981

[30] Foreign Application Priority Data

Feb. 7, 1981 [EP] European Pat. Off. ........ 81100884.6

[51] Int. Cl.$^3$ .......................................... H01L 21/285
[52] U.S. Cl. ..................................... 427/96; 156/643; 156/644; 204/192 E; 427/88; 427/259; 427/91; 427/99; 430/314
[58] Field of Search ................ 430/314; 156/643, 644; 427/88, 96, 99, 259, 91; 204/192 E

[56] References Cited

U.S. PATENT DOCUMENTS 3,767,490  10/1973  Alberts ................................ 156/643
4,076,575  2/1978   Chang .................................. 427/259
4,108,717  8/1978   Widmann ............................. 427/259

OTHER PUBLICATIONS

Ephrath, "Selective Etching of Silicon Dioxide Using Reactive Etching with $CF_4$-$H_2$", J. Electrochem. Soc., vol. 126, No. 8, Aug. 1979.
Chiu et al., "Ion Etch Lift Off Process", IBM TDB, vol. 19, No. 9, pp. 3409-3410, Feb. 1977.
Winter, "Metal Deposition with Polyimide Lift-Off Technique", IBM TDB, vol. 17, No. 5, Oct. 1974.

Primary Examiner—John D. Smith
Attorney, Agent, or Firm—Robert E. Sandt

[57] ABSTRACT

On the layer 12 a mask 3 corresponding to the desired pattern of holes 15 is provided with via openings 14 having overhanging walls. The layer 12 is selectively etched with a method where the etching attack takes place vertically to the layer surface, and wherein the mask 3 is thinned simultaneously, so that holes 15 are obtained having a cross-section increasing toward the mask 3. If subsequently material 16 for filling the holes 15 is applied in a blanket deposition these holes are completely filled when the material 16 has the same thickness as the layer 12 although the openings over the holes are decreasing with increasing thickness of the material 16. The layer 12 consists preferably of an insulation material, the mask 3 of positive photoresist, and the material 16 of a metal.

8 Claims, 9 Drawing Figures

METHOD OF MAKING CONDUCTIVE PATHS THROUGH A LAMINA IN A SEMICONDUCTOR DEVICE

DESCRIPTION

Technical Field

The invention relates to a method of making and filling via holes in a layer of a first material deposited on a substrate wherein a mask having via openings with overhanging walls corresponding to the desired pattern of via holes is first applied to the layer of first material which is then etched using the mask as an etching mask by means of a process having a preferential direction of etching perpendicular to the layer surface, followed by a blanket deposition of a second material which fills the holes and covers the mask with a thickness approximating the layer of the first material, with a final step of stripping off the mask and attached layer of the second material which remains in the holes.

Background Art

For making conductive networks interconnecting semiconductor elements, the generally used practice is first to etch holes in an insulation layer on the semiconductor substrate in those places where contacts are to be made to the semiconductor substrate. Subsequently, the contacts and the conductive network are produced either by the blanket application, preferably by vapor deposition, of a conductive layer over the entire surface, and subsequently generating the conductive network photolithographically, or by applying a photoresist layer wherein the negative of the respective pattern of conductive lines and contacts is generated, by a subsequent blanket application of the conductive line material over the entire surface, and finally by lifting off the photoresist with the conductive line material provided thereon. If the conductive lines are to extend not only in one but in two planes the above described process steps for making the first plane are repeated after the application of another insulating layer. If three or more conductive line planes are to be made the above mentioned process steps are repeated once, or several times beginning from the application of the insulation layer. Due to the fact that the layers of conductive material do not cover a blanket layer but a layer with holes that are planar but have steps. The higher the number of conductive line planes produced, the greater the number and/or the height of these steps. Within the step range, the conductive material layer is thinner than in those places where the layer extends in parallel to the substrate surface, i.e. the thinness of the layer increases with the step height and the steepness of the step. With step heights of approximately 2 $\mu$m and a thickness of the conductive material in the horizontal area of 1 to 1.3 $\mu$m the effect of the above mentioned layer thicknesses is that in the step range there are interruptions either already upon manufacture, or after a short use of the component in the field. The component is thus made useless at least partly. With the above discussed technique, this problem can only be avoided by increasing the thickness of the conductive material accordingly. As the irregularities increase with the number of network planes the thickness of the conductive network plane compared with the preceding one is to be increased with each further network plane. However, a considerable disadvantage of the increased layer thickness is that the possible minimum lateral dimensions of the conductive lines increase, too, which is against the trend toward minimization in the semiconductor field, and higher packing density.

German U.S. Pat. No. 4,076,575, issued Feb. 28, 1976 to Kenneth Chang. describes a method avoiding at least partly the appearance of irregular layers of conductive material. According to this method, a resist mask is applied on an insulation layer, said mask showing openings where holes are to be etched into the insulation layer. Using the resist mask as an etching mask, via holes are etched into the insulation layer, and using the resist mask as an evaporation mask conductive material is subsequently evaporated in a blanket deposition, and finally the resist mask and the conductive material deposited thereon are lifted off by immersion in a suitable solvent. The conductive material for the subsequently made conductive network is then evaporated in a blanket deposition. The method is advantageous in that the evaporation is effected "self-aligned" to the etched holes, but it is not advantageous that the thickness of the first-evaporated layer is to be smaller than that of the insulation layer. If both thicknesses would be the same, bridge formation between the material evaporated in the holes and the material evaporated on the resist mask, and consequent intolerable difficulties in the lift-off process would be unavoidable. Since, therefore, in the method of the U.S. Pat. No. 4,076,575 the thickness of the material in the holes is to be smaller than the thickness of the insulation layer, it follows that the layer of conductive material is irregular which is applied for making the conductive network after the lift off of the photoresist. Furthermore, in the method of the U.S. Pat. No. 4,076,575 there is a gap between the material in the holes and the hole walls, which gap further contributes to an irregularity of the subsequently applied conductive material layer, so that the method of the Offenlegungsschrift presents in any case the same difficulties as the older above mentioned prior art, although at a smaller scale. The method of the U.S. Pat. No. 4,076,575 also comprises as a potential problem the risk that the chemicals used for the resist lift-off cannot be completely removed from the above mentioned gap even with very intensive rinsing, and may thus cause corrosion later on.

U.S. Pat. No. 4,256,532, issued Mar. 17, 1981 to Ingrid Magdo et al describes a method similar to that of the Offenlegungsschrift, but wherein the material in the holes does not have to be thinner than the insulation layer. According to this method, the mask used for etching the insulation layer and for the vapor deposition of the conductive material for filling the via holes, is a silicon mask having openings with overhanging walls, i.e. their cross-section decreases with an increasing distance from the insulation surface. The overhanging shape prevents a bridge formation between the material in the via holes and that on the mask, so that there is no problem if the evaporated layer is of exactly the same thickness as the insulation layer. However, the method of the Magdo et al patent also comprises the gap between the material in the holes and the hole walls, and the consequently appearing irregularities of the conductive layer applied after the mask lift-off. The gap is caused by the fact that with increasing thickness the conductive material grows increasingly in lateral direction over the edge of the mask openings, which practically results in a decrease of the mask opening. Furthermore, the silicon mask is very expensive and can therefore be used economically only if the hole pattern which can be transferred therewith is used very frequently.

SUMMARY OF THE INVENTION

The method as disclosed by the invention makes use of the etch mask thinning normally considered a disadvantage, for the purpose of eliminating the problem of the gradual closing of the mask openings when the material is filled into the holes. If as a first material an insulation material is used, and as a second material a metal the method as disclosed by the invention is excellently suited for the production of one or multi-layer conductive networks since it avoids the problems of prior art with respect to the irregularities of the conductive networks caused by the via holes, and the incomplete filling of the via holes. The structure as disclosed by the invention is highly advantageous even if it is not made under optimum conditions, so that the material in the holes is not fully planar, since such irregularities have turned out to be considerably reduced after the application of the subsequent layer of conductive material.

It is of advantage if a positive photoresist is used as mask material. By means of positive photoresists, mask patterns with via holes having overhanging walls can be made simply and reproducibly. This mask production is described in detail in German Offenlegungsschrift No. 28 55 723.5.

The insulation material is advantageously etched by means of reactive ion etching in a glow discharge. With this etching method the speed ratio which is important for the method as disclosed by the invention, i.e. the ratio of the speeds with which the mask material and the layer for the holes are to be etched, can be reproducibly determined with the geometry of the etching device being considered, through the nature of the etching gas, the gas pressure, gas flow, and high frequency energy.

It is the object of the invention to provide a relatively simple method for generating via holes in a layer, and for depositing material in these holes in such a manner that the holes are completely full, and that the material surface is practically coplanar with the layer surface.

This and other objects, features and advantages of the invention will be apparent from the following, more particular description of the preferred embodiment of the invention, as illustrated in the accompanying drawings.

DETAILED DESCRIPTION OF THE INVENTION

In the following, the method as disclosed by the invention will be described with reference to an embodiment where in a layer holes are made and subsequently completely filled with a material. Reference is made to FIGS. 1 through 9. The starting element (see FIG. 6) is a layer 12 applied on a substrate 11. In the embodiment, layer 12 consists of silicon dioxide, but layer 12 can also consist of other materials, in particular of other insulation materials as e.g. silicon nitride or polyimide. In layer 12, a mask 3 is made having openings in accordance with the pattern to be made in layer 12. Positive photoresist is well suited for mask material since on the one hand, according to a method described in German Offenlegungsschrift No. 28 55 723, a mask having a pattern of openings with overhanging walls can easily be made thereof reproducibly, and since on the other it can be etched simultaneously with silicon dioxide in one etching step. Although positive photoresist is a particularly advantageous mask material the use of the method as disclosed by the invention is not restricted to masks made of this material.

In the following, the production of a mask 3 will be described below with reference to FIGS. 1 to 5. First, a mixture consisting of a positive resist material and a cross-linking agent is made. Suitable positive resist materials are e.g. phenol-formaldehyde resins (Novolaks) with a diazonaphtoquione inhibitor. Such resists are described in U.S. Pat. No. 3,201,239. Suitable samples of these positive resists are the materials marketed by Shipley Company, Inc., Newton, Massachusetts, U.S.A. under the trade names AZ-1350-H and J. As a cross-linking agent a compound of the general formula

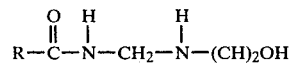

is used, R representing an alkyl group containing preferably between 7 and 17 carbon atoms. This compound can be advantageously produced from the commercially available 1-hydroxy-2-alkylimidazoline marketed by Mona Ind., Inc., Patterson, New Jersey, U.S.A. under the trade name Monazoline C, by means of hydrolysis in that one Mol of monazoline C is made to react with one Mol of water. A predetermined amount of the reaction product is dissolved in a small quantity of solvent, as e.g. cellosolve-acetate, and subsequently mixed with such a quantity of the positive resist that the mixture contains between approximately 1 and approximately 3 g cross-linking agent per 100 ml of the mixture.

For producing the resist layer, a small quantity of the mixture is deposited preferably by spin-on on the substrate on which the resist mask is to be made. The thickness of the deposited layer 1 (see FIG. 1) is preferably between approximately 1.5 and 6 μm. The layer thickness is controlled via the rotational speed of the spin table.

Figure 1:
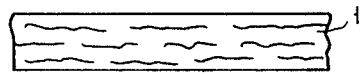
FIGS. 1 through 5 are sections showing the details of the mask in successive steps of preparation.
Figure 2:
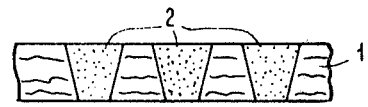

Subsequently, resist layer 1 is prebaked at temperatures between approximately 85° and approximately 105° C. between approximately 10 and approximately 20 minutes, and then irradiated through a mask pattern. Suitable means for irradiation are UV light and electron radiation. During irradiation, the photoactive compound or the inhibitor, respectively, is decomposed in the areas not covered by the irradiation mask, with the decomposition beginning on the surface of resist layer 1. FIG. 2 represents the actual but in reality invisible modification of layer 1 after irradiation through the irradiation mask.

Figure 3:
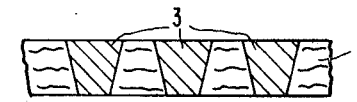

The resist film irradiated through the mask pattern is heated at temperatures between approximately 95° and approximately 110° C. for approximately 10 to approximately 60 minutes. In the previously irradiated zones 2 of the resist layer there is a chemical reaction during which the cross-linking agent reacts in the areas of inhibitor decomposition with the polymer molecules of the resist in such a manner that there is a cross-linking, with the resist layer zones previously rendered soluble being made insoluble again. FIG. 3 shows insoluble and in reality invisible areas 3 made of areas 2 with these process steps. For the temperature processing, a relatively uncomplicated furnace is used permitting a temperature adjustment of ±1°. The temperature processing is usually performed in a nitrogen atmosphere.

Figure 4:
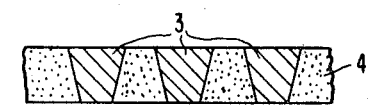
Figure 5:
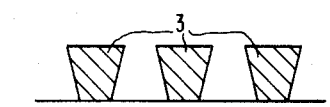

The temperature processing is followed by a blanket irradiation of the resist layer. For irradiation, the same device as for the image-wise irradiation can be used. However, it is also possible to use a UV lamp of high intensity, as e.g. a 200 watt mercury high pressure lamp. For an approximately 2 μm thick resist layer, a reasonable irradiation period would be approximately 50 seconds with the 200 watt lamp. In the blanket irradiation, the inhibitor is decomposed in the areas marked 4 in FIG. 4, i.e. areas 4 are rendered easily soluble in the developer to be used for the positive resist. During developing, the areas irradiated through the irradiation pattern remain, and the areas covered during the first irradiation, i.e. areas 4 in FIG. 4 are dissolved. So a negative of the irradiation mask pattern is made in the resist layer. The mask obtained after developing and consisting of areas 3 is shown in FIG. 5. For developing, all alkaline developers usually applied for developing the positive resists on Novolak basis can be employed. These include aqueous, buffered alkali, as e.g. an aqueous solution of sodium hydrogen phosphate, sodium meta silicate, and sodium hydroxide, and an aqueous solution of sodium meta phosphate and sodium dihydrogen phosphate. The two latter chemicals form the essential components of the product marketed by Shipley Company, Inc. under the trade name AZ-developer which when diluted with distilled water at a ratio of 1:1, is particularly suitable for developing the positive resists marketed by this company. The time needed for developing a resist layer about 2 μm thick is 10 minutes approximately.

For making mask 3 it is advantageous to proceed as follows:

5 g of the cross-linking agent are dissolved in 25 ml cellosolve acetate, and 225 ml AZ-1350 J are admixed to this solution. Prior to further use of the positive resist, the necessary quantity is passed through a filter.

The positive resist mixture is spun onto the substrate for 30 seconds with 2500 rpm resulting in an approximately 2.0 to 2.1 μm thick layer. Subsequently, the resist layer is dried for 20 minutes at 85° C.

The resist layer is then exposed through an irradiation mask pattern. As an exposure device the unit marketed by Perkin-Elmer under the trade name "Micralign-PMA 100" can be used. This unit operates with projection exposure, the irradiation mask being transferred at a ratio of 1:1. Exposure of the resist mask is effected in stripes. Tests have shown that with the faster speed setting 025 a resist mask is obtained which corresponds well to the mask pattern through which irradiation is to be effected. The radiation period is determined in such a manner that several samples are exposed for different periods of time, that subsequently the mask dimensions obtained in developing are measured and compared with the dimensions of the radiation mask pattern. The radiation period is determined as a function of the desired systematic deviation of the resist mask dimensions from the dimensions of the irradiation mask (0 or ±x). Subsequent to the image-wise exposure, the resist layer is exposed to a temperature processing at 100° C. for approximately 50 minutes in a nitrogen atmosphere. The resist layer is then irradiated through a glass layer by means of the Micralign device, the faster speed setting can be 025 again.

For developing the resist layer, AZ developer is used which is diluted with water at a 1:1 ratio, and which has a $p_H$-value of approximately 12.8. The developing period is 10 minutes approximately.

Figure 6:
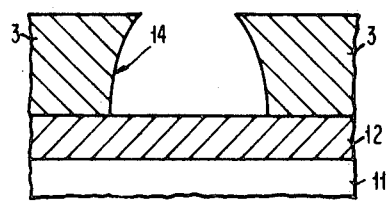
FIGS. 6 through 9 are sections through the semiconductor and mask during successive process steps.

After the production of mask 3, a structure is obtained part of which is shown schematically in a cross-section in FIG. 6. The part shown of mask 3 has an opening 14 with over-hanging walls. The layer thicknesses of the $SiO_2$ layer and of mask 3 are between 0.5 and 4 approximately, and between 1.5 and 6 μm.

Figure 7:
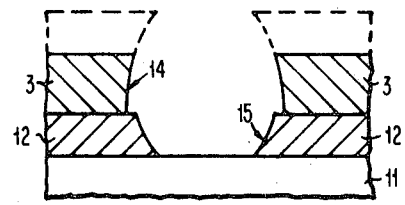

In the next process step, holes 15 are etched into silicon dioxide layer 12 using mask 3 as an etching mask. Etching is preferably performed by means of reactive ion etching in a glow discharge, but it is equally possible to employ other etching methods wherein the etching attack is effected substantially vertically to the surface of layer 12, and wherein silicon dioxide and positive photoresist (or any other material combination) are etched simultaneously. In reactive ion etching, $CF_4$ is preferably used as an etching gas. Favorable results are obtained with a gas pressure between about 13.3 and 66.6 μbar, a gas flow between about 10 and about 100 $cm^3$/min., and a high frequency energy between about 0.1 and 0.3 Watt/$cm^2$. Under these conditions, silicon dioxide is dissolved with a speed of approximately 20 to approximately 25 nm/min., and positive photoresist with a speed of approximately 15 to approximately 20 nm/min. The geometry of the etching device has a certain influence on the etching speeds. Particularly advantageous etching data are a flow speed of 20 $cm^3$/min., a gas pressure of approximately 40 μbar, and a high frequency energy of approximately 0.2 Watt/$cm^2$. Since after the etching of holes 15, mask 3 still has to have a minimum thickness, the mask thickness is to be determined prior to etching as a function of the etching speed ratio and the desired mask minimum thickness after etching. With the given etching conditions, a guide value of approximately 1.5 has proved positive for the ratio of the thickness of mask 3 (prior to etching) and of layer 2. FIG. 7 depicts in a schematic cross-section a part of the structure after etching. The white area framed in small dashes over mask 3 in FIG. 7 represents that part of the mask that is dissolved during etching. Due to the thinning of the mask during etching, the cross-section of mask openings 14 which determines the etching attack widens continuously owing to the overhang of the opening walls. In those parts of layer 12 which are exposed to the etching attack from the beginning the layer material is etched off completely; in those areas which owing to the gradual widening of the mask openings are exposed to the attack only in the course of the etching process there is only a part dissolution, the dissolved layer thickness being proportional to the time during which the individual areas of the layer had been exposed to the etching attack. The profile of hole 15 schematically shown in FIG. 7 is a result thereof.

Figure 8:
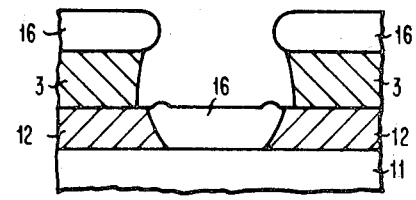
Figure 9:
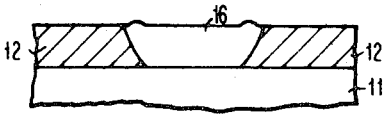

In the next step, a material is applied in a blanket deposition onto the structure shown sectionally in FIG. 7, in order to fill holes 15. In the present case, the material is a vapor-deposited metal. However, holes 15 can also be filled with other materials and by means of other methods provided the material is applied directionally vertically to the surface of layer 12. During evaporation the photoresist should not heat up to such an extent that it starts flowing. Therefore the substrate temperature should be approximately <100° C. during evaporation. Evaporation is continued until the evaporated metal 16, e.g. an alloy of aluminum and copper, has approximately the same thickness as layer 12. The evaporating material grows on mask 3 not only vertically but also horizontally over the edges of mask openings 14 and thus increasingly reduces the cross-section of the masked zones. In prior art (e.g. European Patent application No. 78 100 294.4), this gradual reduction of the cross-section has the effect that the holes in the insulation layer cannot be completely filled. In the method according to the invention, however, the hole profile produced during etching and the reducing of the cross-section of the masked areas co-act during evaporation in such a manner that when the evaporated metal 16 has the same thickness as layer 12 holes 15 are just completely filled, i.e., the filling is substantially flush with the metal which is coplanar with layer 12, and there is no gap between the filling and the hole walls. The structure obtained after evaporation is shown sectionally in a schematic cross-section in FIG. 8. If as indicated in FIGS. 8 and 9 metal filling 16 in holes 15 is not quite planar, e.g., because there had been no optimum conditions during etching and evaporation this is not critical. As pointed out below, the method as disclosed by the invention is preferably used for making a network structure, wherein after the completion of the structure as disclosed by the invention a further metal layer is applied in a blanket deposition on the surface of which small irregularities present in the surface of metal filling 16 in holes 15 are practically compensated.

In the last process step, mask 3 and metal 16 deposited thereon are lifted off. For that purpose, the structure is immersed in hot (100° C.) N-methyl pyrrolidone, subsequently rinsed in azetone and deionized water, and finally dried. The thus obtained structure is represented sectionally in FIG. 9 in a schematic cross-section.

In tests made with the method as disclosed by the invention, holes were etched in a silicon dioxide layer, and subsequently filled, with a diameter of the mask openings between 3.5 and 5.5 $\mu$m. In all tests the diameter of the finished holes had been greater by 0.3 $\mu$m than the diameter of the mask openings. This shows that with the method as disclosed by the invention filled holes having a diameter not greater than some $\mu$m can be reproducibly made, within very small tolerances. The method is thus suitable for use in the production of densely packed highly integrated circuits.

The method as disclosed by the invention can be used very advantageously in the production of single and multi-layer conductive networks establishing the necessary connections in a system of integrated circuits.

In the production of a single-layer conductive network the method as disclosed by the invention is used after in a semiconductor substrate the semiconductor components have been made, and the semiconductor substrate has been fully covered with insultation material. In the present case the semiconductor substrate corresponds to substrate 11 in FIG. 6, and the cover of insulating material corresponds to layer 12. By means of the method as disclosed by the invention, via contact holes are made in the cover, and the holes are filled with a metal filling. Subsequently, for making the conductive network on the thus obtained structure, the negative of the respective conductive network is made on the thus obtained structure in a known manner out of photoresist, e.g. by means of the method described in German Offenlegungsschrift No. 28 55 723. This is followed by metal evaporation in a blanket deposition, and finally the photoresist and the metal applied thereon are lifted off. It is also possible to make the conductive network in that metal is evaporated onto the insulating cover in a blanket deposition, which is then applied with a photoresist mask corresponding to the positive of the respective conductive network pattern, and finally the exposed metal areas are etched off. In single layer conductive networks irregularities are not so critical, so that instead of the method as disclosed by the invention, it is possible to use alternatively other known methods operating with one metal evaporation, wherein the holes are filled and the material for the conductive network is applied.

The advantages of the method as disclosed by the invention are however quite obvious compared with known methods in the production of conductive networks with two and more layers, because it substantially avoids the irregularities which appear in the known methods in the area of the via holes in the insulation layers between two conductive planes, and which are caused by these holes.

If the method as disclosed by the invention is used in the production of multi-layer conductive networks the process starts either—as in the production of one-layer conductive networks—with a semiconductor substrate having an insulating cover and containing semiconductor elements, or with a structure wherein on the semiconductor substrate there is already a first conductive plane made in accordance with known methods and coated with an insulation layer (the insulating cover or the insulation layer correspond to layer 12 in FIG 6, and the areas coated with the cover or insulation layer correspond to substrate 11). After a structure corresponding to that of FIG. 9 has been made in accordance with the method as disclosed by the invention, the first or the next conductive plane is made by means of one of the above mentioned methods. If another or several further conductive planes are to be made, the method as disclosed by the invention and the production of the conductive plane are repeated once or several times, after each application or a respective insulation layer.

Unlike prior art where this is necessary owing to the existing high steps the metal layers, according to the method as disclosed by the invention, do not have to be thicker than required also in the higher layers of the conductive networks to ensure a satisfactory step covering. This means that if the method as disclosed by the invention is used it is possible to form also in the higher layers of the conductive networks very narrow and densely packed conductive lines.

While the invention has been particularly shown and described with reference to the preferred embodiment thereof, it will be understood by those skilled in the art that various changes in form and details may be made therein without departing from the spirit and scope of the invention.

What is claimed is:

1. A method of making and filling holes in a lamina disposed on a substrate comprising forming on said lamina a mask having a plurality of openings through which said lamina is exposed, each of said openings having overhanging walls such that the area of each opening adjacent to the lamina is greater than the area adjacent to the free surface of the mask, subjecting said mask and said lamina to an etching process having a preferred direction of etching perpendicular to the plane of the mask with the etchant being chosen to etch both the mask and the lamina, to thereby etch holes in said lamina and reduce the thickness of the mask, subjecting said mask and the openings therein to the deposition of a filler material having a thickness substantially equal to the thickness of said lamina wherein the disposition has a preferential deposition perpendicular to the face of the mask, and removing said mask with its overlying layer of filler material to thus fully expose said lamina with its pattern of filled holes.

2. The method of claim 1 wherein said lamina is formed from an insulating material and said filler material comprises a conductive material to thereby provide a conductive path through said lamina to the substrate beneath.

3. The method of claim 2 wherein said insulating material is selected from a group containing $SiO_2$, $Si_3N_4$ and polyimide.

4. The method of claim 1 wherein the etching process is a reactive ion etching in a glow discharge.

5. The method of claim 1 wherein the etching process is a reactive ion etching in a glow discharge and the etchant is $CF_4$.

6. The method of claim 1 wherein said mask is comprised of a positive photoresist containing as a cross-linking agent a compound of the general formula

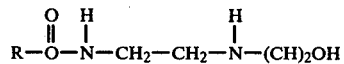

with R representing an alkyl group.

7. The method of claim 1 wherein the initial thickness of the mask is so chosen that at the completion of etching the reduced thickness of the mask is at least equal to the thickness of the lamina.

8. The method of claim 1 wherein said substrate comprises a semiconductor complex with integrated circuitry to which conductive connections are to be made and said lamina comprises an insulating material is selected from a group consisting of $SiO_2$, $Si_3N_4$ and polyimide.

* * * * *